United States Patent
Farnworth et al.

(10) Patent No.: US 7,594,322 B2
(45) Date of Patent: Sep. 29, 2009

(54) METHODS OF FABRICATING SUBSTRATES INCLUDING AT LEAST ONE CONDUCTIVE VIA

(75) Inventors: Warren M. Farnworth, Nampa, ID (US); Steven M. McDonald, Star, ID (US); Nishant Sinha, Boise, ID (US); William M. Hiatt, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/941,358

(22) Filed: Nov. 16, 2007

(65) Prior Publication Data

US 2008/0060193 A1 Mar. 13, 2008

Related U.S. Application Data

(62) Division of application No. 10/755,905, filed on Jan. 12, 2004, now Pat. No. 7,316,063.

(51) Int. Cl.
*H01K 3/10* (2006.01)

(52) U.S. Cl. .............................. 29/852; 29/830; 29/846

(58) Field of Classification Search .................. 29/825, 29/830, 846, 852
See application file for complete search history.

(56) References Cited

U.S. PATENT DOCUMENTS

| | | | |
|---|---|---|---|
| 2,820,752 A | 1/1958 | Heller | |
| 3,577,324 A | 5/1971 | Patterson | |
| 4,179,800 A | 12/1979 | Takaba et al. | |
| 4,211,603 A | 7/1980 | Reed | |
| 4,312,897 A * | 1/1982 | Reimann | 216/18 |
| 4,325,780 A * | 4/1982 | Schulz, Sr. | 216/17 |
| 4,487,654 A * | 12/1984 | Coppin | 216/18 |
| 4,525,246 A * | 6/1985 | Needham | 205/125 |
| 4,605,471 A * | 8/1986 | Mitchell | 216/18 |
| 4,692,349 A | 9/1987 | Georgiou et al. | |
| 4,720,324 A | 1/1988 | Hayward | |
| 4,808,273 A | 2/1989 | Hua et al. | |
| 4,830,264 A | 5/1989 | Bitaillou et al. | |
| 4,954,313 A | 9/1990 | Lynch | |
| 4,978,639 A | 12/1990 | Hua et al. | |
| 5,160,579 A | 11/1992 | Larson | |

(Continued)

FOREIGN PATENT DOCUMENTS

EP 0 907 206 A1 4/1999

(Continued)

OTHER PUBLICATIONS

International Search Report, dated Apr. 12, 2005, 7 pages.

*Primary Examiner*—C. J Arbes
(74) *Attorney, Agent, or Firm*—TraskBritt

(57) ABSTRACT

A method of fabricating a substrate is disclosed. Apertures are formed in a substrate blank. A conductive layer is formed on opposing surfaces of the substrate, as well as inside the apertures. Conductive elements are defined on one or both opposing surfaces by masking and etching. Additional layers of conductive materials may be used to provide a barrier layer and a noble metal cap for the conductive elements. The methods of the present invention may be used to fabricate an interposer for use in packaging semiconductor devices or a test substrate. Substrate precursor structures are also disclosed.

17 Claims, 5 Drawing Sheets

U.S. PATENT DOCUMENTS

| | | | |
|---|---|---|---|
| 5,168,624 A | 12/1992 | Shirai | |
| 5,218,761 A | 6/1993 | Maniwa et al. | |
| 5,224,265 A | 7/1993 | Dux et al. | |
| 5,228,966 A | 7/1993 | Murata | |
| 5,245,751 A | 9/1993 | Locke et al. | |
| 5,262,718 A | 11/1993 | Svendsen et al. | |
| 5,285,352 A | 2/1994 | Pastore et al. | |
| 5,309,632 A | 5/1994 | Takahashi et al. | |
| 5,374,788 A * | 12/1994 | Endoh et al. | 174/266 |
| 5,421,083 A | 6/1995 | Suppelsa et al. | |
| 5,424,245 A | 6/1995 | Gurtler et al. | |
| 5,536,908 A * | 7/1996 | Etchells et al. | 174/257 |
| 5,674,787 A | 10/1997 | Zhao et al. | |
| 5,682,062 A | 10/1997 | Gaul | |
| 5,689,091 A | 11/1997 | Hamzehdoost et al. | |
| 5,853,559 A | 12/1998 | Tamaki et al. | |
| 5,876,580 A | 3/1999 | Lykins, II | |
| 5,897,368 A | 4/1999 | Cole, Jr. et al. | |
| 6,027,995 A | 2/2000 | Chiang et al. | |
| 6,032,527 A | 3/2000 | Genova et al. | |
| 6,072,236 A | 6/2000 | Akram et al. | |
| 6,114,768 A | 9/2000 | Gaul et al. | |
| 6,169,024 B1 | 1/2001 | Hussein | |
| 6,197,664 B1 | 3/2001 | Lee et al. | |
| 6,228,684 B1 | 5/2001 | Maruyama | |
| 6,228,687 B1 | 5/2001 | Akram et al. | |
| 6,228,754 B1 | 5/2001 | Iacoponi et al. | |
| 6,230,400 B1 | 5/2001 | Tzanavaras et al. | |
| 6,235,624 B1 | 5/2001 | Sasaki et al. | |
| 6,242,935 B1 | 6/2001 | Akram | |
| 6,252,300 B1 | 6/2001 | Hsuan et al. | |
| 6,255,126 B1 | 7/2001 | Mathieu et al. | |
| 6,277,412 B1 | 8/2001 | Otterbeck | |
| 6,277,669 B1 | 8/2001 | Kung et al. | |
| 6,291,332 B1 | 9/2001 | Yu et al. | |
| 6,384,481 B1 | 5/2002 | Hussein et al. | |
| 6,406,939 B1 | 6/2002 | Lin | |
| 6,418,616 B2 | 7/2002 | Bhatt et al. | |
| 6,444,576 B1 | 9/2002 | Kong | |
| 6,448,644 B1 | 9/2002 | Lin | |
| 6,468,889 B1 | 10/2002 | Iacoponi et al. | |
| 6,479,382 B1 | 11/2002 | Naem | |
| 6,497,800 B1 | 12/2002 | Talieh et al. | |
| 6,498,381 B2 | 12/2002 | Halahan et al. | |
| 6,529,022 B2 | 3/2003 | Pierce | |
| 6,562,709 B1 | 5/2003 | Lin | |
| 6,565,729 B2 | 5/2003 | Chen et al. | |
| 6,565,730 B2 | 5/2003 | Chakravorty et al. | |
| 6,607,938 B2 | 8/2003 | Kwon et al. | |
| 6,620,731 B1 | 9/2003 | Farnworth et al. | |
| 6,634,100 B2 | 10/2003 | Akram et al. | |
| 6,670,269 B2 | 12/2003 | Mashino | |
| 6,711,812 B1 | 3/2004 | Lu et al. | |
| 6,743,499 B2 | 6/2004 | Suemasu et al. | |
| 6,768,205 B2 | 7/2004 | Taniguchi et al. | |
| 6,852,627 B2 | 2/2005 | Sinha | |
| 6,863,794 B2 | 3/2005 | Tsai et al. | |
| 6,908,845 B2 | 6/2005 | Swan et al. | |
| 6,963,483 B2 | 11/2005 | Chakravorty et al. | |
| 7,007,378 B2 | 3/2006 | Gaudiello et al. | |
| 7,108,776 B2 | 9/2006 | Sakaki | |
| 2004/0173454 A1 | 9/2004 | Olgado et al. | |
| 2004/0178495 A1* | 9/2004 | Yean et al. | 257/723 |

FOREIGN PATENT DOCUMENTS

JP     11-251316     9/1999

\* cited by examiner

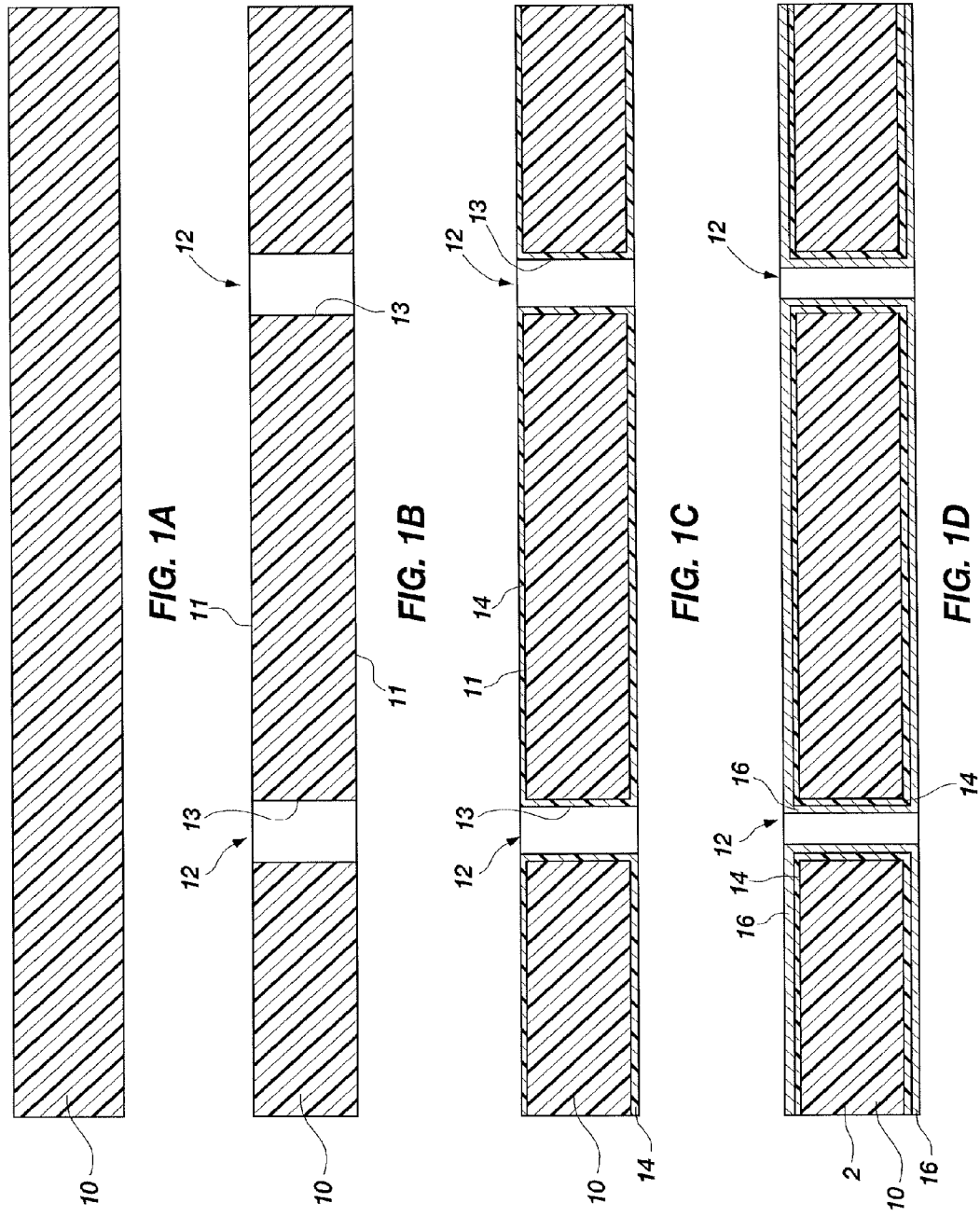

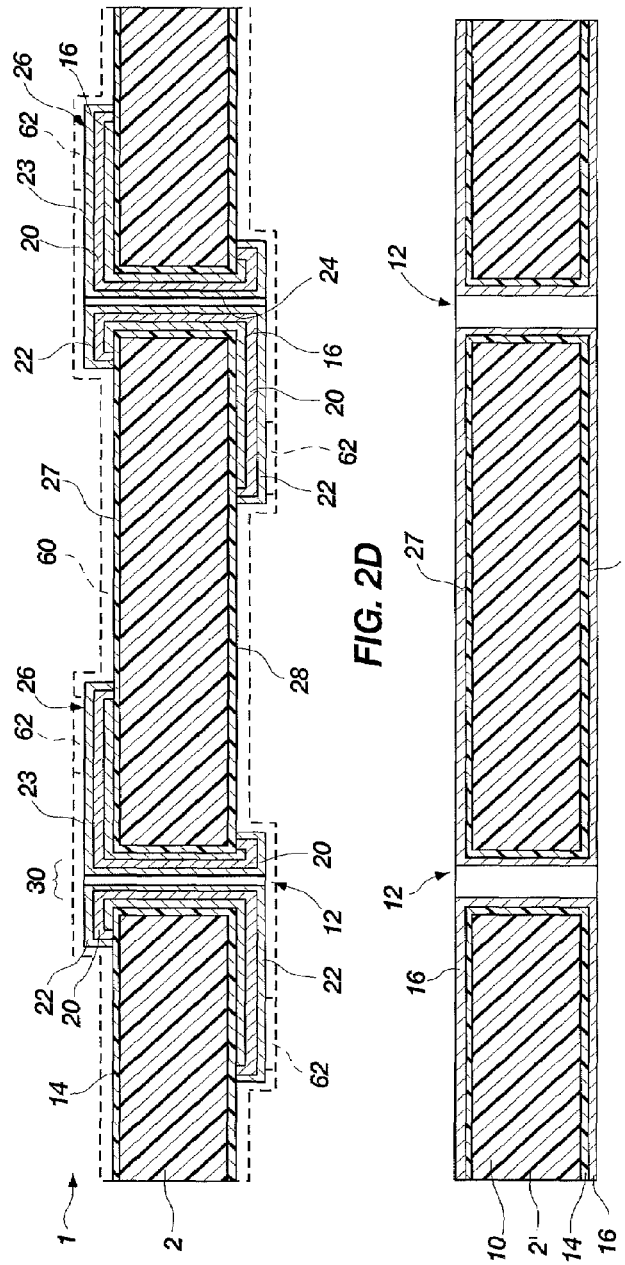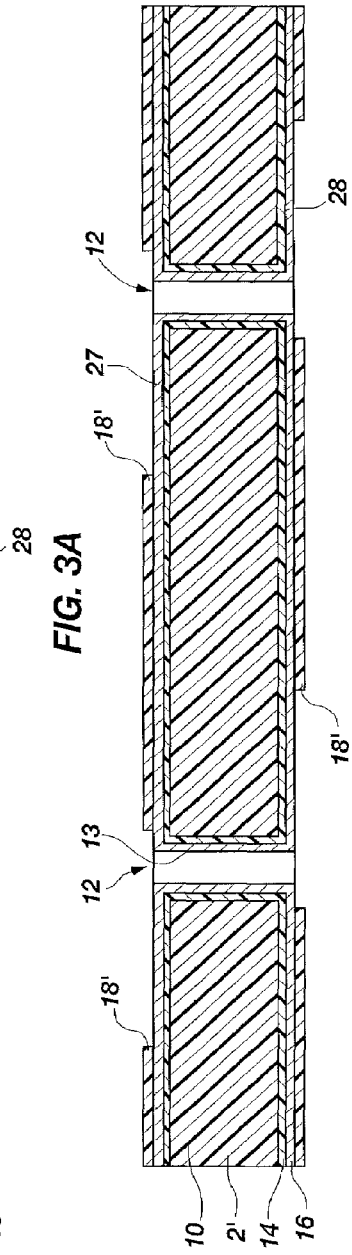

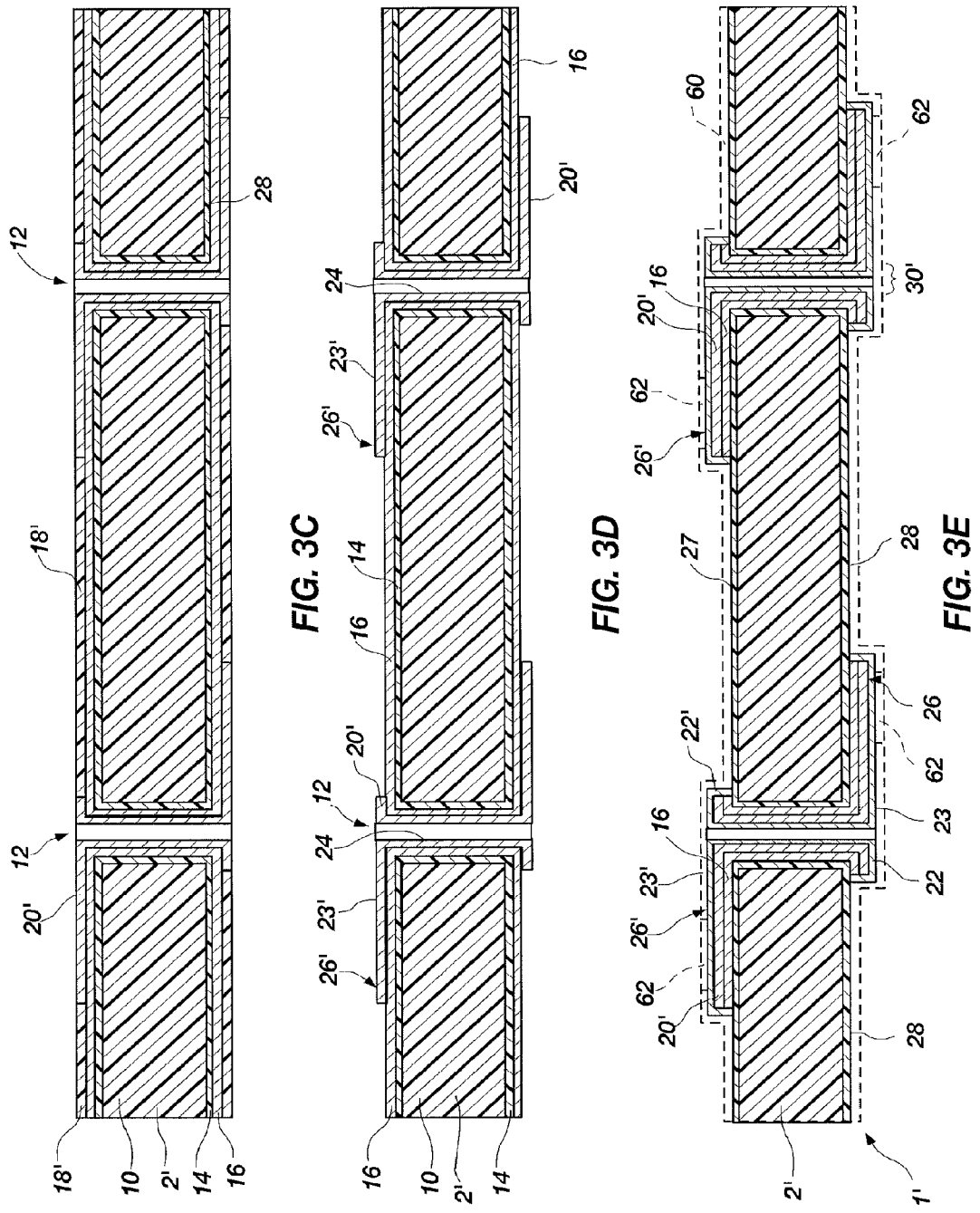

METHODS OF FABRICATING SUBSTRATES INCLUDING AT LEAST ONE CONDUCTIVE VIA

CROSS-REFERENCE TO RELATED APPLICATION

This application is a divisional of application Ser. No. 10/755,905, filed Jan. 12, 2004, now U.S. Pat. No. 7,316,063, issued Jan. 8, 2008, the disclosure of which is hereby incorporated by reference in its entirety.

BACKGROUND OF THE INVENTION

1. Field of the Invention

The present invention relates generally to the fabrication of substrates including, without limitation, interposers. Specifically, the present invention relates to carrier substrates for use in wafer-level packaging and methods for fabricating conductive elements on surfaces, including via walls, of the substrates.

2. State of the Art

Consumers constantly demand more powerful and smaller electronic products. To produce these products at a reasonable cost to the consumer, the semiconductor industry must continually develop newer and more efficient methods and materials for use in fabricating the electronic products.

Along with the trend in the semiconductor industry to decrease semiconductor device size and increase the density of structures on semiconductor devices, the size of the packages of the modern high-performance and high-functionality integrated circuits (ICs) is also ever-decreasing. Thus, the semiconductor industry has been able to save real estate, or space, and decrease the size of the electronic products by improving the methods and materials used in the packaging process. Along with the space savings, the semiconductor industry has also been able to reduce costs and subsequently pass these savings on to the consumer.

In conventional semiconductor device fabrication processes, a number of discrete semiconductor devices, also termed "dice" or "chips," such as memory or microprocessor devices, is fabricated on a bulk semiconductor substrate such as a silicon wafer. After the desired structures, circuitry, and other features of each of the semiconductor devices have been fabricated upon the semiconductor substrate, the individual semiconductor devices may be severed or "singulated" from the substrate and packaged. As discussed above, the size of the packages used to package integrated circuits (ICs) has continued to decrease following the trend in the semiconductor industry toward smaller semiconductor components of increased integrated circuit density. One type of semiconductor device package, the so-called "chip-scale package" or "chip-sized package" ("CSP"), consumes about the same amount of real estate upon higher-level packaging, such as a circuit board, as the bare semiconductor device itself. Such chip-scale packages may themselves include a discrete carrier substrate, or interposer, having roughly the same or slightly larger surface area than the bare semiconductor device. Chip-scale packages may also include protective dielectric material, such as a polymer coating or a molded silicon-filled polymer encapsulant, on one or more surfaces of the semiconductor device.

One example of a chip-scale package is a ball grid array package, which may include a semiconductor die disposed on and electrically connected to an interposer. The interposer includes contact pads on a surface thereof opposite that to which the semiconductor die is secured. Electrical traces of the interposer connected to the bond pads of the semiconductor die lead to the contact pads, which are arranged in a different pattern than that of the bond pads of the semiconductor die, thus rerouting or redistributing the connection pattern of the bond pads of the semiconductor die. The contact pads are arranged in a pattern complementary to that of terminals on a higher-level substrate, such as a circuit board, to which the ball grid array package is to be connected and may have discrete conductive elements such as solder balls or conductive or conductor-filled epoxy bumps, studs, columns or pillars formed thereon for effecting the connection.

Recently, there has been an increased interest in fabricating, packaging, and testing semiconductor devices at the so-called wafer level, in which the fabrication, test, and packaging processes are all implemented substantially on a semiconductor wafer or another bulk semiconductor substrate, such as a partial wafer or a so-called "silicon-on-insulator" (SOI) substrate, such as a silicon-on-glass (SOG) substrate, a silicon-on-ceramic (SOC) substrate or a silicon-on-sapphire (SOS) substrate. A package fabricated at the wafer level typically includes a semiconductor substrate provided with a plurality of various conductive elements, such as semiconductor devices with bond pads, external connection elements (e.g., solder balls), redistribution traces connecting the bond pads and the external connection elements, and an insulating material (e.g., a polymer) extending at least over the active surface and sometimes other surfaces of the semiconductor devices. In some instances, an interposer is used to provide redistribution of the bond pad contact pattern of the semiconductor die.

Interposers used in wafer-level-fabricated semiconductor device packages having ball grid array (BGA) connection patterns are manufactured with various conductive layers, insulative layers, and bonding areas used for the subsequent connection of integrated circuits formed on semiconductor dice of the wafer thereto and placement of discrete conductive elements thereon. Vias may also be formed in the interposer substrate to provide connections between various conductive layers of the interposer or through the entire interposer. Metallization techniques using organometallic compounds, such as chemical vapor deposition (CVD) and physical vapor deposition (PVD), also known as sputtering, may be used to form conductive layers, from which conductive traces, conductive vias, and other conductive structures may be subsequently patterned, such as by masking and etching processes. The use of such conventional processes to form conductive layers and conductive structures is somewhat undesirable when the conductive structures are to be formed on both major surfaces of a substrate since the substrate must be inverted in order to adequately coat both major surfaces with conductive material. Such conventional processes are also undesirable because the process parameters must be carefully controlled to introduce conductive material into vias or recesses of the substrate without the formation of voids, and such processes are costly and time consuming.

Accordingly, there is a need for methods for more efficiently forming conductive elements on substrates that may be suitable, by way of example only, for use as interposers for wafer-level package fabrication.

BRIEF SUMMARY OF THE INVENTION

The present invention, in exemplary embodiments, includes methods for fabricating conductive structures on interposers and other substrates. The methods of the present invention include depositing one or more layers of electrically conductive materials substantially simultaneously on exposed surfaces of an interposer or other substrate precursor structure, such as a substrate blank with one or more vias formed therethrough. As each of the conductive materials may be deposited substantially simultaneously on all desired substrate surfaces, they may be deposited without requiring reorientation (e.g., inversion or flipping) of the substrate blank. The methods also include patterning as well as selectively depositing layers of one or more conductive materials to form conductive elements, such as conductive pads, conductive traces and electrically conductive vias, on the interposer or other substrate. Substrates that are formed in accordance with the present invention may be used for packaging or testing semiconductor devices.

One method of fabricating interposers or other substrates comprises providing a substrate blank, forming at least one aperture in the substrate blank, and depositing and patterning a layer of conductive material over an exposed surface on the substrate blank and into the at least one aperture. The conductive material may be deposited over substantially all of the exposed surfaces of the substrate blank concurrently and at a substantially uniform thickness. By way of example only, electrolytic plating, which is often referred to as "electroplating," or electroless plating processes may be used to form one or more layers of conductive material on a substrate blank to form an interposer or other substrate precursor structure. In addition to depositing conductive material on exposed, opposing surfaces of the substrate blank, conductive material may be deposited on the walls of the at least one aperture that extends through the substrate blank and that is continuous with an exterior surface thereof.

Each layer of conductive material may be patterned by known processes such as, for example, the use of photoresist masks to form conductive traces, electrically conductive vias, or other conductive structures. By way of example only, patterning of a layer of conductive material to define conductive elements on a substrate blank by photoresist deposition, selective exposure and developing followed by etching of unmasked portions of the layer of conductive material may follow the deposition onto all exposed regions thereof. One or more layers of different conductive materials may then be selectively deposited on the defined conductive elements. Alternatively, the patterned mask may be used as a deposition mask to cover portions of a layer of conductive material that are not intended to receive a subsequent layer of conductive material, the mask then being removed and the selectively deposited subsequent layer of conductive material being used as an etch mask for removal of the portion of the initial layer not covered thereby. Yet another layer of conductive material may then be selectively deposited on the subsequent layer.

Interposer and other substrate precursor structures with substantially all of the exposed surfaces thereof, including the surfaces of vias or recesses thereof, covered by one or more layers of conductive material having a substantially uniform thickness are also within the scope of the present invention.

Also within the scope of the present invention are interposer and carrier substrate precursor structures that include mask material thereover, as well as a conductive material covering regions thereof which are exposed through the mask material.

Other features and advantages of the present invention will become apparent to those of skill in the art through consideration of the ensuing description, the accompanying drawings, and the appended claims.

BRIEF DESCRIPTION OF THE SEVERAL VIEWS OF THE DRAWINGS

The nature of the present invention, as well as other embodiments of the present invention, may be more clearly understood by reference to the following detailed description of the invention, to the appended claims, and to the several drawings herein, wherein:

FIGS. 1A-1D illustrate various cross-sectional views of fabrication of a substrate precursor structure bearing a layer of conductive material using methods of the present invention;

FIGS. 2A-2D illustrate various cross-sectional views of the substrate precursor structure of FIG. 1D being further processed into a finished substrate using a first process sequence of the present invention;

FIGS. 3A-3E illustrate various cross-sectional views of the substrate precursor structure of FIG. 1D being further processed into a finished substrate using a second process sequence of the present invention;

DETAILED DESCRIPTION OF THE INVENTION

Figure 2A:
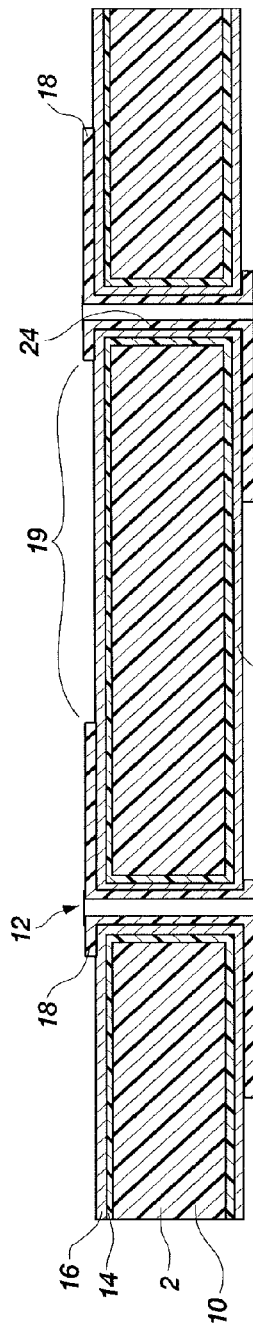

Generally, the present invention includes methods of fabricating interposers and other substrates for use in chip-scale packaging, wafer-level packaging, other types of semiconductor device assembly and packaging and semiconductor device testing, as well as interposers and other substrates that may be fabricated by such methods. While the present invention is described in terms of certain specific, exemplary embodiments, the specific details of these embodiments are set forth in order to provide a thorough understanding of the present invention. It will be apparent, however, that the present invention may be practiced in various combinations of the specific exemplary embodiments presented herein.

In describing the following exemplary embodiments, the terms "wafer" and "substrate" are understood to include any substrate structure, including nonwafer bulk semiconductor substrates and partial wafers having a surface on which an insulating layer or a conductive layer may be formed, as well as substrates formed from materials other than semiconductors. The term "substrate precursor structure" is further used to refer to wafers and other substrates during processing, and may include material layers that have been fabricated thereupon. Wafers, substrates and substrate precursor structures may include doped and undoped semiconductor material, epitaxial semiconductor layers supported by a base semiconductor, as well as other semiconductor structures known to those of ordinary skill in the art. The term "conductor" is understood to include semiconductors, and the terms "insulator" and "dielectric" include any material that is less electrically conductive than the materials referred to as conductors. The term "conductive element" is understood to include contacts to active regions of individual semiconductor devices as well as contacts to other regions on or within a wafer or other substrate. "Conductive element" is also meant to include metal pads, lines, traces, layers, conductive via walls or fillings, combinations thereof and similar conductive regions that may be used to connect individual active devices within an integrated circuit, to connect an integrated circuit and another electronic component to be associated therewith, or to connect between locations on a substrate.

The present invention provides methods for fabricating substrates such as interposers for use in various semiconductor device packaging strategies, including, but not limited to, wafer-level packages and ball grid array packages. The methods described herein provide efficient and cost effective measures for providing substrates of high quality that are less expensive and time-consuming to manufacture than may be conventionally fabricated.

Referring now to FIGS. 1A-1D, there is shown various cross-sectional views of acts involved in fabricating a substrate, such as an interposer, depicting preliminary elements of a method of fabricating the substrate. Referring now to FIG. 1A, there is shown a cross-sectional view of a substrate blank 10 of the substrate. In the illustrated embodiment, the substrate includes a substantially planar substrate blank 10 that may be formed from a semiconductor material, such as silicon, gallium arsenide, or indium phosphide, a ceramic, a plastic or resin, a glass such as a photoetchable glass, or a so-called silicon-on-insulator ("SOI") substrate (e.g., silicon-on-glass ("SOG"), silicon-on-ceramic ("SOC"), silicon-on-sapphire ("SOS"), etc.). One suitable photoetchable glass incorporates a silver halide initiator and is offered as FOTURAN® photoetchable glass by Schott Corporation, Technical Glass Division, of Yonkers, N.Y. It will be appreciated that the substrate blank 10 may also comprise other materials known to those of ordinary skill in the art useful for fabricating test substrates, interposers, and other substrates used in semiconductor device packaging and fabrication.

Referring now to FIG. 1B, there is shown a cross-sectional view of the substrate blank 10 after apertures 12 have been created therein. The apertures 12 may be created using known techniques, such as laser machining or ablation processes, which are also referred to as laser drilling techniques. Other known aperture formation processes, such as masking and anisotropic etching and mechanical drilling, are also encompassed by the present invention and may be employed as suitable for use with the material selected for substrate blank 10. If the photoetchable glass is employed, a collimated, high-intensity ultraviolet (UV) light beam may be used to selectively impinge on substrate blank 10 to form the apertures 12 or the substrate blank 10 may be masked except at aperture locations and the apertures 12 etched using a UV flood light. Registration for placement of the apertures 12 in the substrate blank 10 at the selected locations may be accomplished by marking the substrate blank 10 with fiducial marks (not shown), as known in the art. The fiducial marks may be detected by known processes, such as by using scanning projection aligners that function to position the substrate blank 10 for an accurate placement of the apertures 12. As illustrated, the apertures 12 extend through the substrate blank 10, but it will be appreciated that some or all of the apertures 12 may not extend through the substrate blank 10. Electroless deposition may result in effective step coverage in such so-called "blind" vias if the distribution of activating ions in the solution is uniform and deposition is somewhat slow. It is also beneficial to place seed particles at the bottom of such vias, rather than on the walls, the latter approach resulting in the conductive material closing over with a void in the center of the via. It will be apparent from the following description that electrically conductive vias may be subsequently formed within the apertures 12.

Referring now to FIG. 1C, there is shown a cross-sectional view of the substrate blank 10 after an insulative or dielectric layer 14 has been formed or deposited on substantially an entire exposed surface 11 thereof or at least on the regions of exposed surface 11 that are to have conductive structures disposed thereover. As used herein, the term "entire exposed surface" will be used to refer to every exposed surface 11 of the substrate blank 10, including the surfaces of any material layers that were previously formed on the substrate blank 10, and surfaces 13 of the apertures 12 extending through the substrate. As the insulative or dielectric layer 14 functions to electrically insulate exposed surfaces 11 of the substrate blank 10 and apertures 12 from conductive elements that are to be subsequently formed on the substrate blank 10, insulative or dielectric layer 14 is useful on substrate blanks 10 formed from semiconductive or conductive materials, as well as for improving the adherence of subsequently formed layers to the substrate. Accordingly, insulative or dielectric layer 14 may not be necessary on substrate blanks 10 that are formed from dielectric materials (e.g., substrate blanks 10 formed from glasses, certain ceramics, resins, other polymers, etc.). The insulative or dielectric layer 14 may be formed in situ by known techniques (e.g., silicon dioxide) or by applying other insulative materials (e.g., polymeric insulating materials including polyimides and PARYLENE™ polymers, silicon nitride, silicon oxynitride, and glasses such as borosilicate glass (BSG), phosphosilicate glass (PSG), and borophosphosilicate glass (BPSG)). For example, an insulative or dielectric layer 14 of silicon dioxide may be grown onto the exposed surfaces 11 of a substrate blank 10 that comprises silicon. Alternatively, the insulative or dielectric layer 14 may be deposited on the substrate blank 10 using known techniques, such as chemical vapor deposition ("CVD"), including low-pressure chemical vapor deposition (LPCVD) and plasma-enhanced chemical vapor deposition (PECVD), as appropriate, for deposition of tetraethylorthosilicate ("TEOS"), silicon nitride, or silicon oxynitride, a spin-on process (e.g., spin-on-glass ("SOG") or a spin-on polyimide coating) or a PARYLENE™ process wherein a dimer is vaporized to a monomer and then exposed at lower temperatures to a surface to deposit a tenacious polymer thereon. An exemplary dimer used in the PARYLENE™ process is di-para-xylene. The insulative or dielectric layer 14 may overlie substantially the entire exposed surface 11 of the substrate blank 10, including the surfaces 13 of the apertures 12.

Continuing with the illustrated example, once an insulative or dielectric layer 14 has been formed, deposited, or otherwise positioned on the exposed surfaces 11 of substrate blank 10, as depicted in FIG. 1D, a conductive base layer 16 is applied over substantially all of the exposed regions of the surface of the insulative or dielectric layer 14 that overlie the substrate blank 10. The conductive base layer 16 may have a substantially uniform thickness and be applied substantially simultaneously to substantially all of the exposed surfaces of the insulative or dielectric layer 14 (i.e., without requiring reorientation, such as inversion, of the substrate blank 10). It will be appreciated that the exposed surface of insulative or dielectric layer 14 may be roughened, as known in the art, to enhance the adhesion of the conductive base layer 16 to the insulative or dielectric layer 14. As shown in FIG. 1D, the conductive base layer 16 covers the entire surface of the insulative or dielectric layer 14, including regions of the insulative or dielectric layer 14 that are located within each aperture 12.

As noted above, a substrate of a dielectric material may not require an insulative or dielectric layer 14 and conductive base layer 16 may, therefore, be formed directly on exposed regions of the exposed surface 11 of the substrate blank 10. Regions of the exposed surface 11 of such a dielectric substrate blank 10 to which conductive material is to be directly applied may be mechanically or chemically roughened prior to application of conductive material thereto.

The conductive base layer 16 may be deposited using electroless metal plating, wherein the substrate blank 10 is placed in an electroless plating bath, such that metal is chemically deposited to form the conductive base layer 16. It will be appreciated that electroless plating of metals is an economical method of depositing metal when compared to other metal deposition processes known to those of ordinary skill in the art. In the illustrated embodiment, copper may be deposited to form the conductive base layer 16, resulting in a substrate precursor structure 2 (FIG. 1D). As used herein, the term "electroless plating" will be used to refer to autocatalytic plating processes by which metal is deposited onto an object without the passage of electric current. Electroless plating baths and solutions are well known in the art and are available commercially from companies such as Shipley Ronal, with headquarters in Marlborough, Mass., or Packaging Technologies, with headquarters in Santa Clara, Calif. Electroless plating processes bathe all parts of the object to be coated in a constant concentration of metal ions and, thus, deposit metal in a substantially even thickness over edges, corners, and into holes (such as apertures 12) of an object. One exemplary metal which may be electrolessly deposited is copper. However, in addition to depositing copper, other metals, including, but not limited to, nickel, cobalt and copper alloyed with magnesium or other metals, cobalt, silver, iridium, gold, tungsten, molybdenum, platinum, palladium, nickel-phosphorus (NiP), palladium-phosphorus (Pd—P), cobalt-phosphorus (Co—P), a Co—W—P alloy, other alloys of the foregoing metals and mixtures thereof may alternatively be electrolessly deposited to form the conductive base layer 16.

In an electroless plating process, a seed layer (not shown) of a conductive material is deposited over the surfaces of the substrate blank 10 and the inner surface 13 of apertures 12. In the illustrated embodiment, the seed layer may comprise titanium nitride (TiN), titanium (Ti), silicon nitride ($Si_3N_4$), a polysilicon, tantalum nitride (TaN), or copper. Deposition processes that may be used to deposit the seed layer include CVD, PVD (sputtering), atomic layer deposition (ALD), PECVD, and vacuum evaporation. It will be apparent that the selection of the type of material and deposition process utilized to deposit the seed layer will vary depending on the type of material used to form the conductive base layer 16. The seed layer is then coated with a conductive base layer 16 of metal using an electroless deposition process. The conductive base layer 16 is deposited on the seed layer and, thus, over all surfaces of substrate blank 10 bearing the seed layer. The type and thickness of the metal to be used in the conductive base layer 16 will vary depending on the desired conductivity which may be determined, at least in part, by the resistance (R) of the metal or conductive layer expressed by the equation $R=\rho L/A$ as known in the art.

By coating the seed layer with the conductive base layer 16 of a suitable metal, an annular conductive path is created through the apertures 12. The electroless plating process forms a substantially conformal coating in the apertures 12 that is substantially free of any voids or keyholes. The conductive base layer 16 formed from the electroless plating process will typically have a uniform thickness and a low porosity, will provide corrosion protection and will be relatively hard. The electroless plating process is accomplished by placing the substrate blank 10 into a bath containing an aqueous solution of the metal to be deposited in ionic form. The aqueous solution also includes a chemical reducing agent such that the metal may be deposited without the use of electrical energy. The driving force for the reduction of the metal ions and subsequent deposition in the electroless plating process is driven by the chemical reducing agent. The reduction reaction is essentially constant at all points on the seed layer so long as the aqueous solution is sufficiently agitated (for example, by ultrasound) to ensure that a uniform concentration of metal ions and reducing agents is distributed in the aqueous solution.

In another embodiment, the conductive base layer 16 may be deposited using an electrolytic plating process. In the electrolytic process, the substrate blank 10 is placed in an electrolytic plating bath and an electrical current is passed through the bath between an anode and the substrate blank 10, which serves as a cathode. The current causes the metal in the bath to be deposited over a conductive seed layer deposited on the substrate blank 10 (e.g., directly on the exposed surface 11 thereof or on the insulative or dielectric layer 14 overlying the substrate blank 10). It will be appreciated that other metals, in addition to copper and nickel, including, but not limited to, tin-lead alloy, tin, gold, palladium-nickel alloy, brass, bronze, cadmium, chromium, iron, lead, zinc, and rhodium, may be deposited as the conductive base layer 16 using the electrolytic process. Electroless or electrolytic plating processes may be used to form the conductive base layer 16 on substantially all of the exposed surfaces 11 of the substrate precursor structure 2 substantially simultaneously and with a substantially uniform thickness.

It will be apparent that sputtering may also be used, as known to those of ordinary skill in the art, to form the conductive base layer 16 with other metals such as, for example, aluminum. Alternatively, conductively doped polysilicon may be used as the conductive base layer 16 and deposited by methods well known in the art, such as by depositing a polysilicon layer using chemical vapor deposition (CVD). It will be appreciated that other methods of depositing a conductive base layer 16 including, but not limited to, physical vapor deposition (PVD) or chemical vapor deposition (CVD) using organometallic precursors and a vacuum (to draw the conductive material into the aperture 12) may also be used to deposit various conductive materials, including electrically conductive metals to form the conductive base layer 16, as known in the art. However, it is currently preferred to use electroless plating to form the conductive base layer 16 in view of the far lower cost than other techniques such as CVD, PVD and sputtering. Further, a substantially uniform thickness of conductive base layer 16 may be difficult to achieve using electrolytic plating techniques, which may substantially increase the cost of plating due to anode cost.

Referring now to FIGS. 2A-2D, there are shown various cross-sections of the substrate precursor structure 2 being further processed using an electroless plating process to form a substrate. In reference to FIG. 2A, a mask 18 is formed over portions of the conductive base layer 16 on the substrate precursor structure 2. By way of example only, the mask 18 may comprise a so-called "photomask," which has been formed by a selectively exposed (patterned) and developed photoresist material which may be, as desired, either a positive or negative photoresist. Openings 19 in the mask 18 expose regions, or unmasked portions, of the conductive base layer 16 to be removed by etching processes, as known in the art, to define conductive elements in the form of traces, terminal pads, and the like on one or both opposing surfaces of substrate blank 10.

The apertures 12 may be used to align the substrate precursor structure 2 for patterning of the mask 18 on both surfaces of the substrate precursor structure 2. Such alignment may be used for the conventional, large lithography techniques used to pattern the mask 18 because the feature size of the conductive elements to be formed is fairly large and, therefore, submicron accuracy is not necessary. As previously described herein, the apertures 12 may be positioned on the substrate precursor structure 2 such that the position of the apertures 12 in relation to each other and in relation to other features on the substrate precursor structure 2, such as the peripheral edges thereof, is known. The apertures 12 may be used together (e.g., two, three or more of the apertures 12) and, optionally, in conjunction with fiducial marks (not shown) on the substrate precursor structure 2 for more accurate positioning of the substrate precursor structure 2 for X, Y and theta (rotational) alignment for patterning of the mask 18. For example, fiducial marks in at least two locations may be used for X, Y and theta alignment or a hole and a fiducial mark in close proximity may be employed. The fiducial marks and/or the apertures 12 may be optically scanned, such as by known machine vision systems, to effect appropriate relative positioning of the mask pattern with substrate precursor structure 2. Alternatively, features of the substrate precursor structure 2 may be used to effect appropriate alignment thereof with the mask pattern. For example, notches in at least two edges of the substrate precursor structure 2 may be used with mechanical contact aligners, such as three pins, one spring loaded, to secure the substrate precursor structure 2 in position.

Figure 2B:
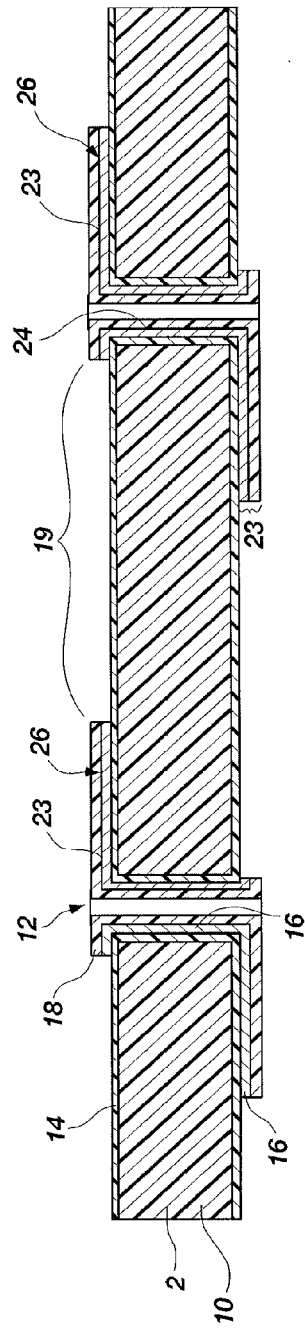

Referring now to FIG. 2B, there is shown the substrate precursor structure 2 after portions of the conductive base layer 16 that were exposed through openings 19 in the mask 18 have been removed, as by etching, to expose portions of the underlying insulative or dielectric layer 14. One suitable etchant, if conductive base layer 16 comprises copper, may be nitric acid. In other embodiments, etchants that selectively etch copper that may be used include, for example, acid cupric chloride, ferric chloride or persulfate. In some instances, an etchant desirable for etching conductive base layer 16 may undesirably strip the photoresist material of mask 18. Thus, depending on the selected etchant, the mask 18 may comprise a hard mask such as, for example, oxide or a plating mask, wherein the hard mask or the plating mask is resistant to a harsh etchant such as, for example, nitric acid. The portions of conductive base layer 16 remaining after etching define the locations of conductive elements in the form of contact pads 26, conductive traces 23, and conductive via walls 24. As depicted in FIG. 2A, the mask 18 is also used to mask the conductive base layer 16 comprising conductive via walls 24 within the apertures 12 and, thus, preserves those portions of the conductive base layer 16 within the aperture 12. Once patterning of the conductive base layer 16 is complete, the mask 18 may be removed using a known photoresist stripping process or other mask-removal process suitable for the type of mask 18 employed, as is known in the art. Timing of the removal of mask 18 will be dependent upon whether electrolytic or electroless plating is used to apply additional conductive materials.

Figure 2C:
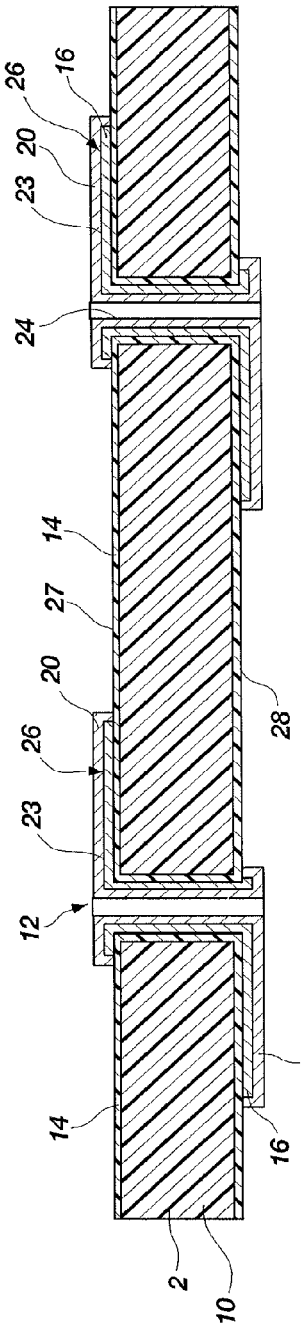

A conductive barrier layer 20 may be formed over the conductive elements on substrate precursor structure 2 as shown in FIG. 2C. The conductive barrier layer 20 may, by way of example only, be formed using an electroless plating process. In the illustrated embodiment, the conductive barrier layer 20 is nickel, but it will be appreciated by those of ordinary skill in the art that other barrier-type materials may be used, such as tantalum nitride, tantalum silicon nitride, titanium nitride, titanium silicon nitride, tungsten nitride, tungsten silicon nitride, tantalum carbide, cobalt tungsten, and molybdenum nitride, within the scope of the present invention. In the illustrated embodiment, the conductive barrier layer 20 is deposited by placing the substrate precursor structure 2 in an electroless nickel plating bath. It will be apparent to those of ordinary skill in the art that deposition of the conductive barrier layer 20 may be desirable, or not, depending on the type of material used for the conductive base layer 16. For example, in the illustrated embodiment, a copper oxide may otherwise form on the bare copper of conductive base layer 16. Even though copper has lower resistance and a higher conductivity when compared to nickel (e.g., electrical conductivity of copper is 0.596 compared to 0.143 for nickel), nickel may be used to coat the copper to prevent the formation of the copper oxides since wire bonds, solder balls, and other conductive structures do not adhere well to copper oxides. The conductive barrier layer 20, such as nickel, is therefore deposited to facilitate securing of conductive structures to desired locations on the conductive base layer 16. However, if conductive materials that are conducive to securely receiving such conductive structures, such as nickel, are used for the conductive base layer 16, then the conductive barrier layer 20 may be eliminated. As shown in FIG. 2C, the conductive barrier layer 20 is formed after the conductive base layer 16 is patterned, plates only onto the copper of the conductive elements, and so does not contact the insulative or dielectric layer 14. Furthermore, if conductive base layer 16 is formed of palladium or platinum, alone or in conjunction with gold, no nickel barrier layer is required. On the other hand, if conductive base layer 16 comprises silver, a conductive barrier layer 20, such as nickel, would be desirable to avoid attack of the silver by sulfides. Similarly, an aluminum conductive base layer 16 may benefit from a conductive barrier layer 20 (e.g., nickel). However, if wire bonds are to be attached to a contact pad 26, it would be desirable to leave an aluminum conductive base layer 16 exposed.

A noble metal conductive cap layer 22 may be formed over the conductive elements of the substrate precursor structure 2 following the formation of the conductive base layer 16 with, if included, the formation of the conductive barrier layer 20. In the illustrated embodiment and referring to FIG. 2D, the noble metal conductive cap layer 22 comprises gold and is deposited using an electroless gold plating bath, as is known in the art. As illustrated in FIG. 2D, the noble metal conductive cap layer 22 overlies the conductive barrier layer 20 on the conductive elements of substrate precursor structure 2, including within the aperture 12. Once the gold noble metal conductive cap layer 22 has been deposited, formation of conductive elements in the form of contact pads 26, conductive traces 23, and conductive via walls 24 of the substrate precursor structure 2 is completed, producing substrate 1.

Other metals that may be used to form the noble metal conductive cap layer 22 include, but are not limited to, palladium, platinum, silver, or alloys thereof. It will be appreciated that the different types of metals used for the noble metal conductive cap layer 22, the conductive barrier layer 20, and the conductive base layer 16 may vary and determine what other types of metals may be used in the associated layers.

For example, in the illustrated embodiment, the conductive base layer 16 is copper, the conductive barrier layer 20 is nickel, and the noble metal conductive cap layer 22 is gold. Accordingly, the selection of which metals to use in each of the conductive base layer 16, the conductive barrier layer 20 and the noble metal conductive cap layer 22 may vary depending on the characteristics and mutual compatibility of the various metals. It will be apparent to those of ordinary skill in the art that the conductive via walls 24 of conductive via 30 (FIG. 2D) and corresponding conductive traces 23 may be used to electrically mutually connect corresponding contact pads 26 or other components on opposing surfaces 27, 28 of the substrate precursor structure 2.

One or both of the conductive barrier layer 20 and the noble metal conductive cap layer 22 may have a substantially uniform thickness and be sequentially formed by electroless plating on the conductive base layer 16 substantially simultaneously over portions of opposing surfaces 27, 28 of the substrate precursor structure 2 and within apertures 12. As disclosed, such additional layers 20, 22 of conductive material are preferably formed following the patterning of conductive base layer 16 but may, instead, be formed by blanket deposition over opposing surfaces 27, 28 and within apertures 12 prior to patterning for formation of conductive elements in the form of contact pads 26, conductive traces 23, and conductive via walls 24. However, it is difficult to select an etchant that would be equally suitable for etching all three metals, and endpoint detection for the etching of each conductive layer for transfer of substrate precursor structure 2 to a different etch bath for each metal currently renders this approach undesirable.

Referring now to FIGS. 3A-3E, there are shown cross-sections through another substrate precursor structure 2' at various levels of another exemplary process for fabricating a substrate 1', such as an interposer, therefrom. As described above in reference to FIG. 1B, an insulative or dielectric layer 14 may be formed on at least a portion of the exposed surfaces 11 of the substrate blank 10. FIG. 3A shows a substrate precursor structure 2' after a conductive base layer 16 has been formed on an insulative or dielectric layer 14 that has been formed on the substrate blank 10, as described herein with reference to FIGS. 1A-1D. The conductive base layer 16 is formed substantially simultaneously on opposing surfaces 27, 28 of the substrate precursor structure 2', as well as on the surfaces thereof that define apertures 12 therethrough. All of the regions of the conductive base layer 16 may have substantially uniform thicknesses. Formation of the conductive base layer 16 by an electrolytic plating process may be effected substantially simultaneously on all exposed surfaces of the substrate blank 10 and impart the conductive base layer 16 with a substantially uniform thickness. By way of example only, the conductive base layer 16 may include copper.

A mask 18' of photoresist material similar to that of mask 18 depicted and described with respect to FIG. 2A may be deposited, exposed to pattern the photoresist material, and developed to define the locations of conductive elements on substrate blank 10.

The process depicted in FIGS. 3A-3E differs from that described in reference to FIGS. 2A-2D by the manner in which a mask 18' is used. As shown in FIG. 3B, the mask 18' is formed or positioned on portions of the conductive base layer 16 that are not to have a conductive barrier layer 20' formed thereon. In the illustrated embodiment, the mask 18' does not cover the interior of the aperture 12 or regions on the opposing surfaces 27, 28 of the substrate precursor structure 2' upon which conductive traces 23, conductive via walls 24, and contact pads 26, that are covered by the subsequently formed conductive barrier layer 20', are to be located. With the mask 18' in place, the conductive barrier layer 20' may be deposited by any suitable process. Portions of the conductive barrier layer 20' that overlie exposed portions of conductive base layer 16 on each opposing surface 27, 28 of the substrate precursor structure 2' as well as on the interior surfaces 13 of the substrate precursor structure 2' that are located within apertures 12 may be formed at substantially the same time by electrolytic plating. As with conductive base layer 16, the conductive barrier layer 20' may have a substantially uniform thickness.

Referring to FIG. 3C, nickel may be used to form the conductive barrier layer 20'. The conductive barrier layer 20' is deposited by placing the substrate precursor structure 2' in a suitable electrolytic plating bath. In the case of an electrolytic plating bath, an electric current is passed through the bath such that the nickel is deposited on exposed areas of the conductive base layer 16 serving as a cathode on the substrate precursor structure 2', including those within the apertures 12.

Once the conductive barrier layer 20' is deposited, the mask 18' may be removed from the substrate precursor structure 2' using a conventional resist strip process for removing photomasks, or any other suitable mask removal method known in the art, as shown in FIG. 3D. After removal of the mask 18', the conductive base layer 16 may be patterned using the conductive barrier layer 20' as a mask and an etchant which is selective for the material of the conductive base layer 16 over that of the conductive barrier layer 20' (e.g., nitric acid, acid cupric chloride, ferric chloride and persulfate selectively etch copper).

Following at least the formation of the conductive barrier layer 20', a noble metal conductive cap layer 22' may be deposited on the conductive barrier layer 20'. All portions of the noble metal conductive cap layer 22' (i.e., portions thereof over opposing surfaces 27, 28 of the substrate precursor structure 2', as well as portions thereof within apertures 12) may be substantially simultaneously formed to exhibit a substantially uniform thickness.

By way of example only, a deposition process which selectively deposits material onto metal, such as the electroless plating methods previously described herein with reference to FIG. 2D, may be used to form the noble metal conductive cap layer 22'. For example, gold may be used to form the noble metal conductive cap layer 22' but, as previously described herein, other metals may also be used to form the noble metal conductive cap layer 22'.

A substrate 1, 1' produced using the methods of the present invention may be further configured with contact pads 26', fabricated in respective communication with corresponding electrically conductive via 30, 30' through conductive traces 23, 23'. It will be appreciated that the contact pads 26, 26' may be used for outer lead bonding sites for subsequent placement of discrete conductive elements such as solder balls or conductive or conductor-filled epoxy bumps, studs, columns or pillars. A patterned protection layer of dielectric material, such as a layer 60 of polymer shown in broken lines in FIGS. 2D and 3E may also be formed and patterned on opposing surfaces 27, 28 of the substrate precursor structure 2, 2' to expose contact pads 26, 26' and used as a solder barrier to contain solder during reflow used to form conductive solder balls thereon or during connection of substrate 1, 1' to, for example, a flip-chip configured semiconductor die having solder balls thereon.

Figure 4A:
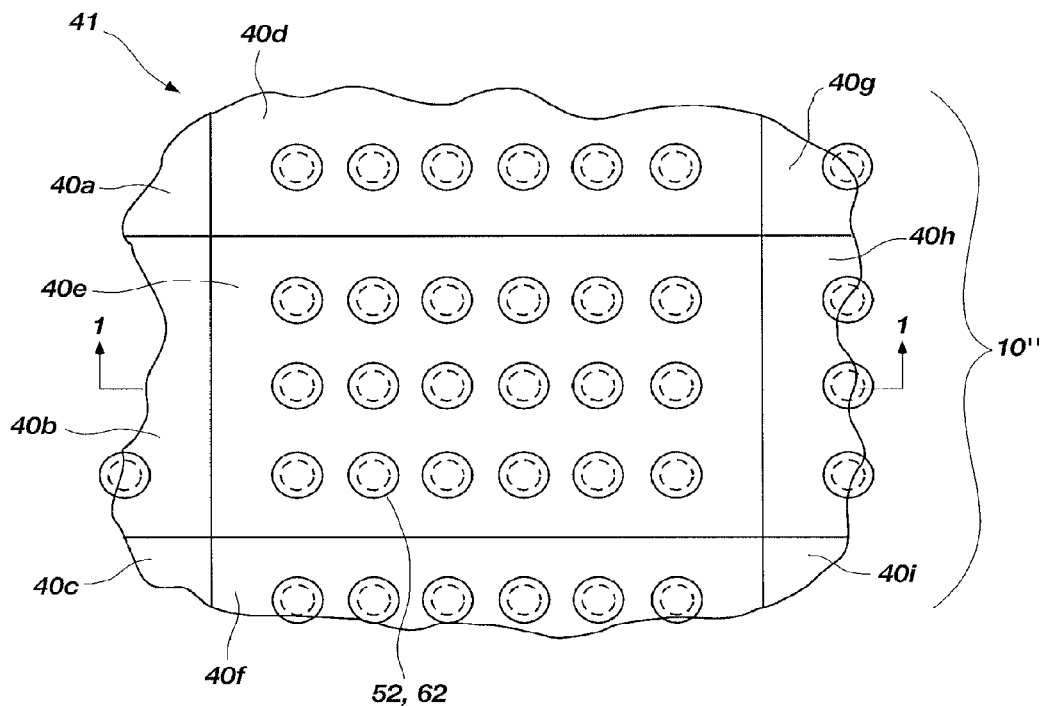
FIG. 4A is a top view of a plurality of substrates that may be fabricated at the wafer level using the methods of the present invention.
Figure 4B:
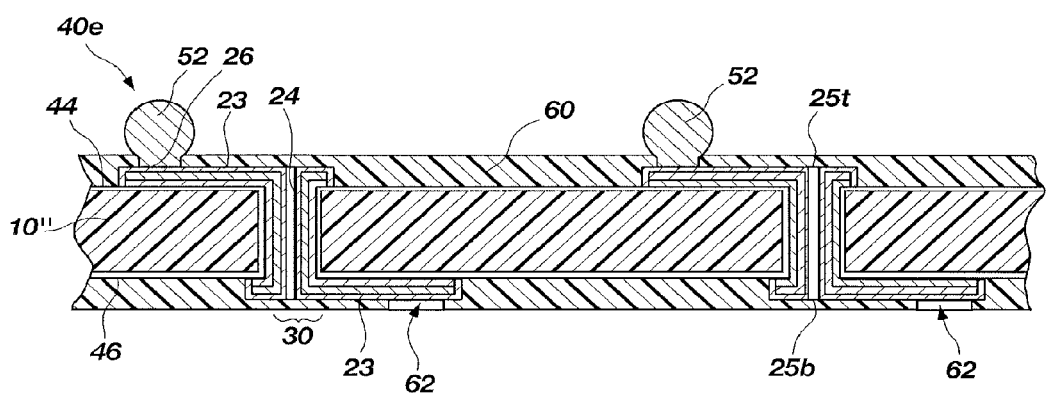
FIG. 4B is a partial cross-section of a portion of the plurality of substrates of FIG. 4A.

Referring now to FIGS. 4A and 4B, there is shown a large substrate, such as a wafer-scale substrate generally at 41, that may be used to simultaneously fabricate a large plurality of interposers or other substrates 40a-40i (collectively referred to herein as "substrates 40") using the methods of the present invention. It will be apparent that the description of the methods and materials used to fabricate the substrates 40 correlates with the description of the fabrication methods used for forming a substrate 1, 1', as previously described herein with reference to FIGS. 1A-3D. Referring now to FIG. 4A, shown is a top view of the large substrate 41 depicting the several substrates 40a-40i. FIG. 4B illustrates a partial cross-section of a single substrate 40e along line 1-1 of FIG. 4A, which includes a substantially planar substrate blank 10", which may be formed from an electrically nonconductive material, such as glass, a ceramic, a resin or a polymer, or an at least partially insulator-coated semiconductive or conductive material. As depicted in FIG. 4A, the substrates 40a-40i may be simultaneously fabricated on a single, large substrate 41 such as a full or partial wafer of silicon, germanium, gallium arsenide or indium phosphide, or another bulk semiconductor substrate, such as a so-called silicon-on-insulator ("SOI") substrate in the form of a silicon-on-ceramic ("SOC"), silicon-on-glass ("SOG"), or silicon-on-sapphire ("SOS") substrate. Once the substrates 40 have been fabricated, the individual substrates 40 may be singulated, or diced, from the large substrate 41 as known in the art.

Each resulting substrate 40 may include a plurality of conductive traces 23 extending from conductive vias 30 to contact pads 26. As shown in FIG. 4B, a top 25t and/or a bottom 25b of each conductive via 30 is substantially level with an associated conductive trace 23 and contact pad 26 on a top surface 44 and a bottom surface 46 of the substrate 40e. As illustrated, a protective, dielectric polymer layer 60 extends over top surface 44 and bottom surface 46, with apertures 62 (see also FIGS. 2D and 3E) therethrough providing locations for conductive structures 52 such as solder balls or locations for access by test probes. As depicted in FIG. 4B, the protective layer 60 may exhibit a relatively planar surface across top surface 44 and bottom surface 46, rather than being conformal to the topography of the traces 23 as depicted in FIGS. 2D and 3E.

It will be further appreciated that the substrates 40 may be fabricated with the various insulative or dielectric layers 14, conductive base layers 16, conductive barrier layers 20, 20' and noble metal conductive cap layers 22, 22' (see FIGS. 2A-3E), as previously described herein, such that the substrates 40 are configured for the subsequent placement of circuit elements thereon or therein. Furthermore, contact pads 26 and conductive traces 23 may be fabricated on both the top and bottom surfaces 44 and 46 of the substrate 40 for connection to various circuit elements and other conductive elements as previously described herein. Conductive structures 52 may be placed in communication with conductive vias 30 or contact pads 26 of the substrate 40 or another carrier substrate, as known in the art. Conductive structures 52 that may be used include, but are not limited to, bumps, balls, studs, columns or pillars of any suitable conductive material, such as solder, another metal or metal alloy, conductive or conductor-filled epoxy, a conductive elastomer such as an anisotropically conductive film, or the like. It will also be appreciated by those in the an that the substrate 40 described herein may be configured as an interposer or other carrier substrate and have a semiconductor device (not shown) secured adjacent to the top surface 44 thereof. Also, the bottom surface 46 of the substrate 40 may be assembled with a test structure (not shown). It will be apparent that the substrate 40 described herein may be further processed for subsequent use in packaging structures, such as a ball grid array (BGA) package. Furthermore, as previously described herein, a protective layer 60 of a polymer material may be formed on the top and bottom surfaces 44 and 46 of the substrate 40 and around contact pads 26 to provide a solder barrier.

Although the present invention has been shown and described with respect to illustrated embodiments, various additions, deletions and modifications that are obvious to a person of ordinary skill in the art to which the invention pertains, even if not shown or specifically described herein, are deemed to lie within the scope of the invention as encompassed by the following claims.

What is claimed is:

1. A method of fabricating a substrate, comprising:
   providing at least one substrate blank having a surface and another, opposing surface;
   forming at least one aperture through the at least one substrate blank between the surface and the another, opposing surface;
   forming a dielectric layer over the surface of the at least one substrate blank and the another, opposing surface of the at least one substrate blank and over an inner surface of the at least one substrate blank within the at least one aperture;
   forming a conductive layer concurrently over the dielectric layer on the surface of the at least one substrate blank, and the another, opposing surface of the at least one substrate blank and over the dielectric layer on the inner surface of the at least one substrate blank within the at least one aperture;
   depositing another conductive layer comprising a metal on selected regions of the conductive layer, including within the at least one aperture; and
   patterning the conductive layer using the another conductive layer as a mask pattern and defining at least one conductive element extending over a portion of at least one of the surface of the at least one substrate blank and the another, opposing surface of the at least one substrate blank and over the inner surface of the at least one substrate blank within the at least one aperture.

2. The method of claim 1, wherein patterning the conductive layer further comprises selectively etching the conductive layer using an etchant.

3. The method of claim 1, wherein forming the conductive layer comprises forming doped polysilicon.

4. The method of claim 1, wherein forming the conductive layer comprises forming a metal layer by electroless or electrolytic plating of the at least one substrate blank.

5. The method of claim 1, further comprising electrolessly plating the another conductive layer with a further layer of a different metal.

6. The method of claim 1, wherein patterning the conductive layer comprises forming a mask pattern over the conductive layer to leave a portion of the conductive layer extending over a portion of at least one of the surface of the at least one substrate blank and the another, opposing surface of the at least one substrate blank and over the inner surface of the at least one substrate blank within the at least one aperture exposed.

7. The method of claim 6, wherein depositing the another conductive layer is effected by electrolytic plating.

8. The method of claim 7, further comprising removing the mask pattern and removing portions of the conductive layer uncovered by the another conductive layer by etching.

9. The method of claim 8, further comprising electrolytically plating the another conductive layer with a further layer of a different metal.

10. The method of claim 6, further comprising removing the mask pattern and removing portions of the conductive layer uncovered by the another conductive layer by etching.

11. The method of claim 10, further comprising electrolytically plating the another conductive layer with a further layer of a different metal.

12. The method of claim 1, further comprising defining the at least one conductive element to include at least one conductive trace in communication with a conductive lining on the inner surface of the at least one substrate blank within the at least one aperture and extending over at least one of the surface of the at least one substrate blank and the another, opposing surface of the at least one substrate blank.

13. The method of claim 12, further comprising terminating the at least one conductive trace in a conductive pad.

14. The method of claim 13, further comprising covering the at least one conductive trace with a dielectric layer and leaving at least a portion of the conductive pad exposed.

15. The method of claim 14, further comprising forming a discrete conductive element on the exposed at least a portion of the conductive pad.

16. The method of claim 15, further comprising forming the discrete conductive element as a solder ball.

17. The method of claim 1, wherein providing the at least one substrate blank comprises providing a plurality of unsingulated substrate blanks and further comprising singulating the substrate blanks of the plurality after depositing the another conductive layer of a metal on the at least one conductive element.

* * * * *